(12) United States Patent
Andersen et al.

(10) Patent No.: US 12,387,942 B2
(45) Date of Patent: Aug. 12, 2025

(54) MODIFYING PATTERNED FEATURES USING A DIRECTIONAL ETCH

(71) Applicant: Applied Materials, Inc., Santa Clara, CA (US)

(72) Inventors: Tassie Andersen, Salem, MA (US); Shurong Liang, Lynnfield, MA (US)

(73) Assignee: Applied Materials, Inc.

( * ) Notice: Subject to any disclaimer, the term of this patent is extended or adjusted under 35 U.S.C. 154(b) by 296 days.

(21) Appl. No.: 17/969,368

(22) Filed: Oct. 19, 2022

(65) Prior Publication Data
US 2024/0136197 A1 Apr. 25, 2024
US 2024/0234161 A9 Jul. 11, 2024

(51) Int. Cl.
| | | |
|---|---|---|
| *H01L 21/311* | (2006.01) | |
| *H01L 21/3065* | (2006.01) | |
| *H01L 21/3213* | (2006.01) | |
| *H01J 37/32* | (2006.01) | |

(52) U.S. Cl.
CPC .... *H01L 21/31116* (2013.01); *H01L 21/3065* (2013.01); *H01L 21/31138* (2013.01); *H01L 21/32137* (2013.01); *H01J 37/32422* (2013.01)

(58) Field of Classification Search
CPC .......... H01L 21/31116; H01L 21/3065; H01L 21/31138; H01L 21/32137; H01L 21/31111; H01J 37/32422
See application file for complete search history.

(56) References Cited

U.S. PATENT DOCUMENTS

| | | | |
|---|---|---|---|
| 9,287,123 B2 | 3/2016 | Srinivasan et al. | |
| 10,381,232 B2 | 8/2019 | Ruffell et al. | |
| 10,535,522 B1* | 1/2020 | Shu | ...... H01J 37/3171 |
| 10,971,368 B2* | 4/2021 | Sherman | ............. H01L 21/3065 |
| 11,043,380 B2 | 6/2021 | Ruffell et al. | |
| 11,119,405 B2* | 9/2021 | Evans | ............... H01J 37/32422 |
| 11,402,649 B2* | 8/2022 | Evans | ................ G02B 27/0103 |
| 2015/0311073 A1* | 10/2015 | Srinivasan | ........ H01L 21/02543 |
| | | | 438/504 |
| 2019/0096739 A1* | 3/2019 | Yang | .................. H01L 21/76804 |
| 2020/0117080 A1* | 4/2020 | Evans | ............... H01L 21/32131 |
| 2021/0375626 A1 | 12/2021 | Anglin et al. | |

* cited by examiner

*Primary Examiner* — Anita K Alanko
(74) *Attorney, Agent, or Firm* — KDW Firm PLLC

(57) ABSTRACT

Disclosed herein are approaches for modifying patterned features using a directional etch. In one approach, a method may include providing a stack of layers of a semiconductor device, forming an opening through the stack of layers, the opening defined by a first sidewall and a second sidewall, and delivering ions into the first sidewall in a reactive ion etching process. The ions maybe delivered at a first non-zero angle relative to a perpendicular extending from the substrate, wherein the reactive ion etching process removes a first portion of the stack of layers from just a lower section of the first sidewall.

20 Claims, 7 Drawing Sheets

US 12,387,942 B2

MODIFYING PATTERNED FEATURES USING A DIRECTIONAL ETCH

FIELD OF THE DISCLOSURE

The present disclosure relates to semiconductor structures and, more particularly, to modifying patterned features using a directional etch.

BACKGROUND OF THE DISCLOSURE

As semiconductor devices continue to scale to smaller dimensions, the ability to pattern features becomes increasingly difficult. These difficulties include in one aspect the ability to obtain features at a target size for a given technology generation. Another difficulty is the ability to obtain varied sidewall shapes of a patterned feature, such as an opening or trench. For example, given a fixed ion beam angle, there is a critical aspect ratio above which the ion beam is blocked from reaching the bottom of the trench. At this point lateral etch sharply drops.

With respect to these and other considerations the present improvements may be useful.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a stack of layers of a semiconductor device, and forming an opening through the stack of layers, the opening defined by a first sidewall and a second sidewall. The method may further include delivering ions into the first sidewall in a reactive ion etching process, wherein the ions are delivered at a first non-zero angle relative to a perpendicular extending from the substrate, and wherein the reactive ion etching process removes a first portion of the stack of layers from just a lower section of the first sidewall.

In another aspect, a method for patterning opening sidewalls may include providing a stack of layers of a semiconductor device, the stack of layers including a first layer formed over a base layer, a second layer formed over the first layer, and a third layer formed over the second layer. The method may further include forming an opening through the stack of layers, and directing ions into a sidewall of the first layer in a first reactive ion etch process, wherein the ions are delivered through the opening at a first non-zero angle relative to a perpendicular extending from the substrate, wherein the reactive ion etch process removes a lower portion of the sidewall of the first layer, and wherein a plane defined by the sidewall of the first layer is oriented at the first non-zero angle after the lower portion of the sidewall of the first layer is removed.

In yet another aspect, a method may include providing a stack of layers of a semiconductor device, the stack of layers including a first layer formed over a base layer, a second layer formed over the first layer, and a third layer formed over the second layer. The method may further include forming an opening through the stack of layers, and directing ions into a sidewall of the first layer in a first reactive ion etch process, wherein the ions are delivered through the opening at a first non-zero angle relative to a perpendicular extending from the substrate, wherein the reactive ion etch process removes a lower portion of the sidewall of the first layer without removing an upper portion of the sidewall of the first layer, and wherein a plane defined by the sidewall of the first layer is oriented at the first non-zero angle after the lower portion of the sidewall of the first layer is removed.

BRIEF DESCRIPTION OF THE DRAWINGS

The accompanying drawings illustrate exemplary approaches of the disclosure, including the practical application of the principles thereof, as follows.

Figure 1A:
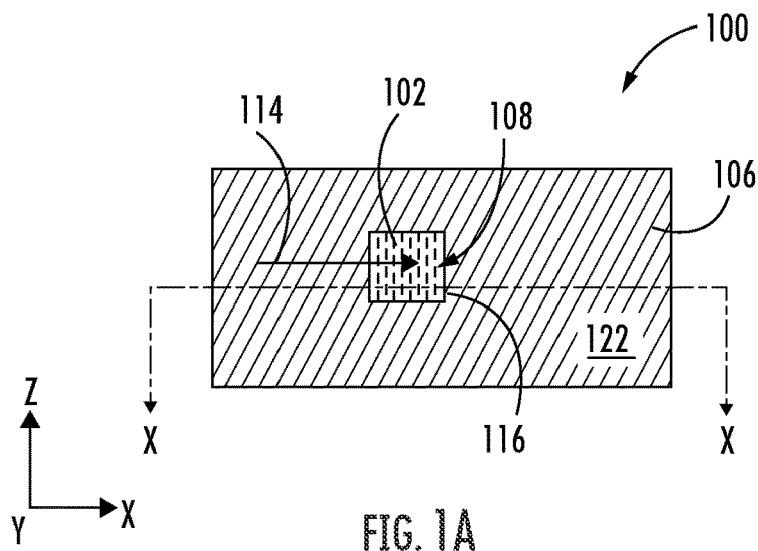
FIG. 1A is a top view of a semiconductor device, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art.

To address the deficiencies of the prior art described above, embodiments of the present disclosure advantageously provide an angled etch to form cavities (e.g., trenches or openings) having non-vertical sidewalls. In some embodiments, multiple etch processes are used to form sidewalls having more than one surface angle. In yet other embodiments, different material layers having different etch rates may be etched at an angle to form sidewalls having more than one surface angle. As a result, the cavities may increase volume and surface area for a conductive (either electrical or heat) fill and/or to increase adhesion area. Furthermore, the angled etch allows manipulation or correction of the sidewall shape, as well as etch depth control without the need for an etch-stop landing layer.

Figure 1B:
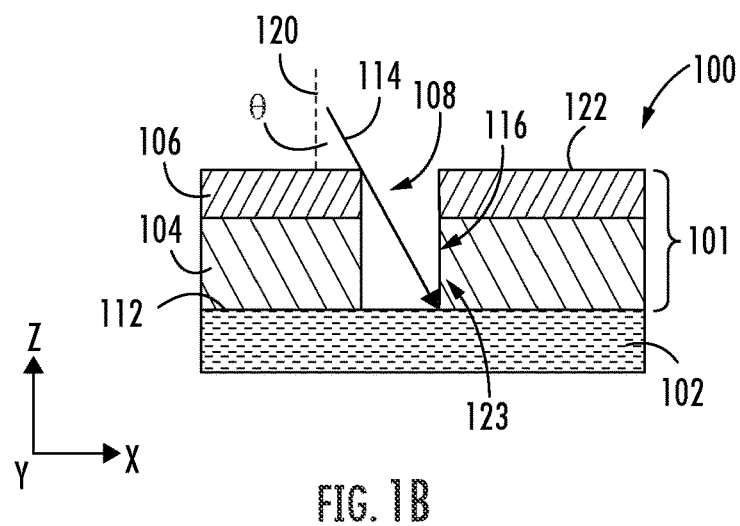
FIG. 1B is a cross-sectional side view of the device along cutline X-X' of FIG. 1A, according to embodiments of the present disclosure.

FIGS. 1A-1B depict a portion of a semiconductor device (hereinafter "device") 100 including a plurality of layers 101 atop a base layer or substrate 102. As shown, the plurality of layers 101 may include a first layer 104 formed atop the substrate 102, and a second layer 106 formed atop the first layer 104. An opening 108 may be formed through the plurality of layers 101, exposing an upper surface 112 of the substrate 102. The first layer 104 may be a first material type, while the second layer 106 may be a second material type, different than the first material type. In various embodiments, the materials of the first and second layers 104, 106 may be any combination of the following non-limiting materials: $SiO_2$, a-Si (amorphous Si), spin-on carbon, photoresist, metal photoresist, TiN, doped carbon, or SiN.

As further shown, reactive ions of a first angled etch 114 may be delivered into a first sidewall 116 of the opening 108 at a first non-zero angle 'Θ' relative to a perpendicular 120 extending from a top surface 122 of the second layer 106. The reactive ions of the first angled etch 114 may also impact a portion of the upper surface 112 of the substrate 102 within the opening 108, but to minimal effect. Although non-limiting, the reactive ions of the first angled etch 114 may include F, Cl, Br, and/or others.

Figure 1C:
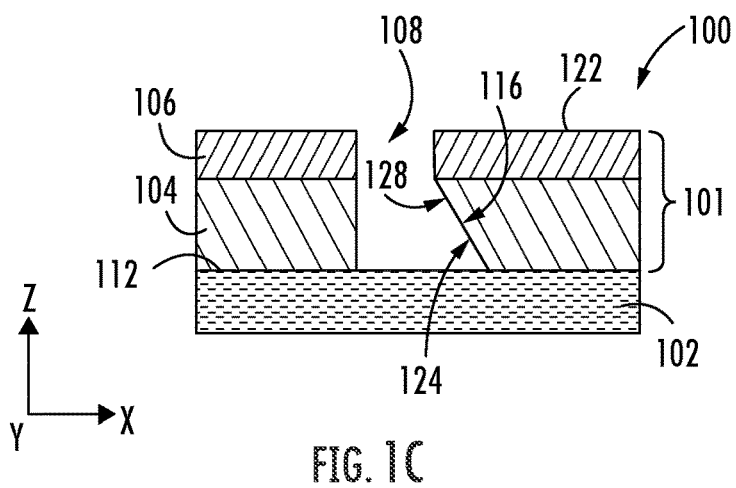
FIG. 1C is a cross-sectional side view of the device of FIG. 1A along cutline X-X' following an angled etch, according to embodiments of the present disclosure.

As shown in FIG. 1C, the first angled etch 114 removes a first portion 123 (FIG. 1B) of the stack of layers 101 from just a lower portion 124 of the first layer 104 of the first sidewall 116. Because the first and second layers 104, 106 each have a different etch selectivity, the first layer 104 is etched but the second layer 106 generally is not. An upper section 128 of the first sidewall 116 is generally less affected by the first angled etch 114 due to shadowing from the second layer 106. As a result, a plane defined by the sidewall 116 of the first layer 104 is oriented at the first non-zero angle 'Θ' after the lower portion 124 of the first layer 104 is removed. In other embodiments, the plane defined by the sidewall 116 of the first layer 104 may be oriented at a second non-zero angle relative to the perpendicular 120. A width (e.g., along the x-direction) of the opening 108 is greater adjacent the upper surface 112 of the substrate 102 than adjacent the second layer 106. Said another way, a notch or indentation is therefore present in the first layer 104, tucked beneath the second layer 106.

Figure 2A:
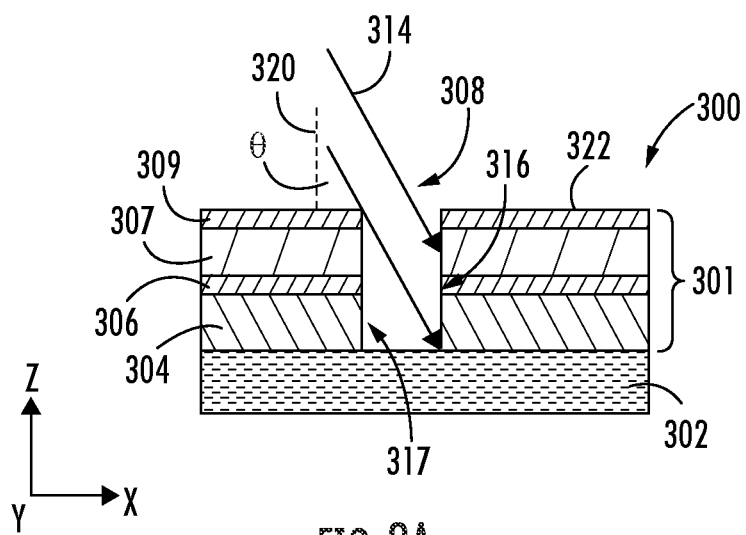
FIG. 2A is a cross-sectional side view of a device during an angled etch, according to embodiments of the present disclosure.

FIG. 2A depicts a portion of another semiconductor device (hereinafter "device") 300 according to embodiments of the present disclosure. The device 300 may include a plurality of layers 301 atop a substrate 302. As shown, the plurality of layers 301 may include a first layer 304 formed atop the substrate 302, a second layer 306 formed atop the first layer 304, a third layer 307 formed atop the second layer 306, and a fourth layer 309 formed atop the third layer 307. An opening 308 may be formed through the plurality of layers 301. The first layer 304 may be a first material type, the second layer 306 may be a second material type, the third layer 307 may be a third material type, and the fourth layer 309 may be a fourth material type. In this embodiment, the first layer 304 and the third layer 307 are different materials. As such, the first layer 304 and the third layer 307 may have different etch rates. In various embodiments, the materials of the plurality of layers 301 may be any combination of the following non-limiting materials: $SiO_2$, a-Si (amorphous Si), spin-on carbon, photoresist, metal photoresist, TiN, doped carbon, or SiN.

As further shown, reactive ions of a first angled etch 314 may be delivered into a first sidewall 316 of the opening 308 at a first non-zero angle 'Θ' relative to a perpendicular 320 extending from a top surface 322 of the fourth layer 309. In the embodiment shown, the reactive ions of the first angled etch 314 may be delivered to each of the exposed plurality of layers 301. Although non-limiting, the reactive ions of the first angled etch 314 may include F, Cl, Br, and/or others.

Figure 2B:
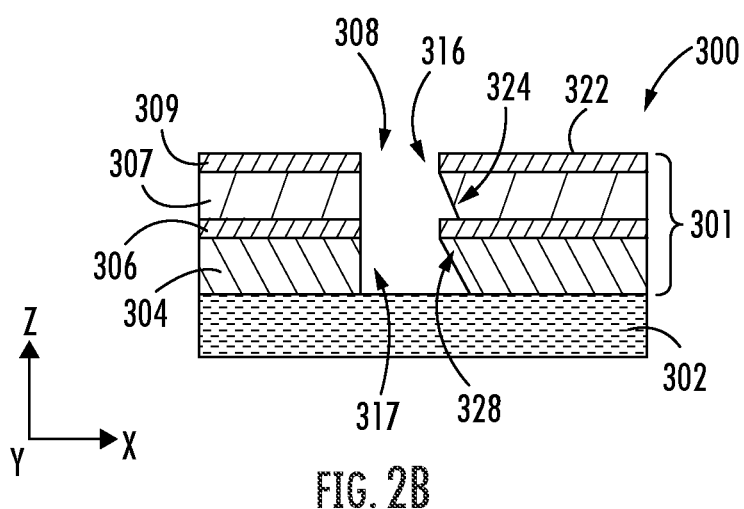
FIG. 2B is a cross-sectional side view of the device of FIG. 2A following the angled etch, according to embodiments of the present disclosure.

As shown in FIG. 2B, the first reactive ion etch 314 removes a portion of material from just a lower portion 324 of the first layer 304 and the third layer 307. An upper section 328 of the first and third layers 304, 307 is generally less affected by the first reactive ion etch 314 due to shadowing from the second layer 306 and the fourth layer 309, respectively. Because the first and third layers 304, 307 each have a different etch selectivity relative to the second layer 306 and the fourth layer 309, the first layer 304 and the third layer 307 are etched while the second and fourth layers 306, 309 generally are not. However, the first and third layers 304, 307 are not etched equally. As a result, after the lower portion 324 of the first and second layers 304, 307 is removed, a first plane defined by the sidewall 316 along the first layer 304 and a second plane defined by the sidewall 316 along the third layer 307 are oriented at different non-zero angles relative to the perpendicular 320.

Although not shown, a second reactive ion etch may be performed along a second sidewall 317 of the opening 308, similar to the first reactive ion etch 314. That is, ions of the second reactive ion etch may be delivered into the second sidewall 317 at a second non-zero angle relative to the perpendicular 320. The second reactive ion etching process removes a portion of material from a lower section of the first and third layers 304, 307 without removing material from an upper section of the first and third layers 304, 307. In some embodiments, following the second reactive ion etch, the first sidewall 316 mirrors the second sidewall 317.

Figure 3A:
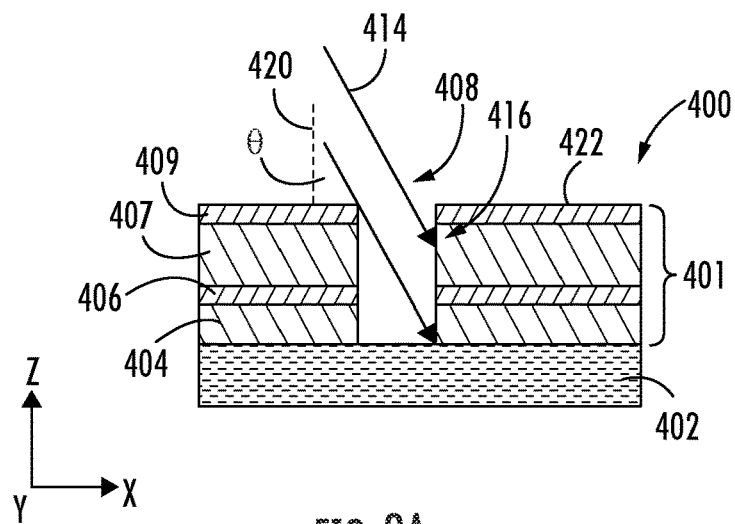
FIG. 3A is a cross-sectional side view of a device during a first angled etch, according to embodiments of the present disclosure.

FIG. 3A depicts a portion of another semiconductor device (hereinafter "device") 400 according to embodiments of the present disclosure. The device 400 may include a plurality of layers 401 atop a substrate 402. As shown, the plurality of layers 401 may include a first layer 404 formed atop the substrate 402, a second layer 406 formed atop the first layer 404, a third layer 407 formed atop the second layer 406, and a fourth layer 409 formed atop the third layer 407. An opening 408 may be formed through the plurality of layers 401. In some embodiments, the first layer 404 and the third layer 407 are the same material, while the second layer 406 and the fourth layer 409 are the same material. As such, the first layer 404 and the third layer 407 may have a same etch selectivity, and the second layer 406 and the fourth layer 409 may have a same etch selectivity, different than the etch selectively of the first layer 404 and the third layer 407.

As further shown, reactive ions of a first angled etch 414 may be delivered into a first sidewall 416 of the opening 408 at a first non-zero angle 'Θ' relative to a perpendicular 420 extending from a top surface 422 of the fourth layer 409. In the embodiment shown, the reactive ions of the first angled etch 414 may be delivered to each of the exposed plurality of layers 401.

Figure 3B:
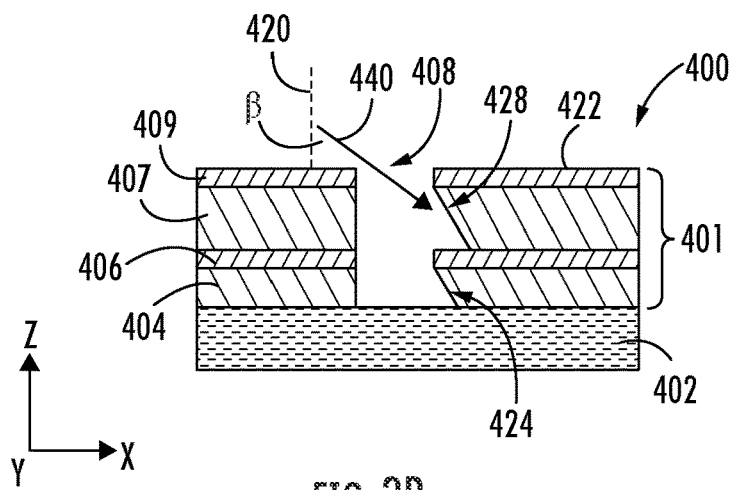
FIG. 3B is a cross-sectional side view of the device of FIG. 3A during a second angled etch, according to embodiments of the present disclosure.

As shown in FIG. 3B, the first reactive ion etch 414 removes a portion of material from just a lower portion 424 of the first layer 404 and the third layer 407. An upper section 428 of the first and third layers 404, 407 is generally less affected by the first reactive ion etch 414 due to shadowing from the second layer 406 and the fourth layer 409, respectively. Because the first and third layers 404, 407 have a different etch selectivity relative to the second layer 406 and the fourth layer 409, the first layer 404 and the third layer 407 are etched while the second and fourth layers 406, 409 generally are not. As a result, after the lower portion 424 of the first and second layers 404, 407 are removed, a first plane defined by the sidewall 416 along the first layer 404 and a second plane defined by the sidewall 416 along the third layer 407 are oriented at a non-zero angle (e.g., the first non-zero angle 'Θ') relative to the perpendicular 420. In this embodiment, the first and second planes are oriented at approximately the same angle relative to the perpendicular 420 following the first reactive ion etch 414. In other embodiments, the first and second planes may be oriented at different angles relative to the perpendicular 420 following the first reactive ion etch 414, e.g., in the case the materials of the first and third layers 404, 407 have different etch rates.

Figure 3C:
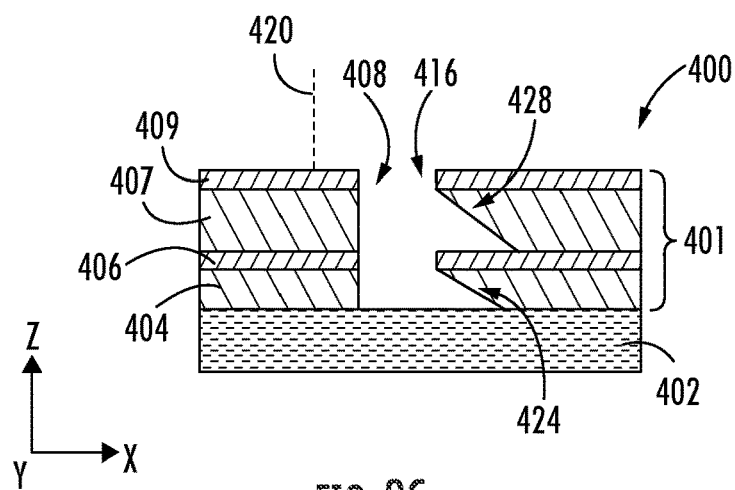
FIG. 3C is a cross-sectional side view of the device of FIG. 3B following the angled etch, according to embodiments of the present disclosure.

In some embodiments, reactive ions of a second angled etch 440 may be delivered into the first sidewall 416 of the opening 408 at a second non-zero angle 'β' relative to the perpendicular 420, as further shown in FIG. 3B. In this case, the second non-zero angle 'β' is greater than the first non-zero angle 'Θ', which causes the second angled etch 440 to impact just the third layer 407 without impacting the first layer 404. As a result, the lower portion 424 of the third layer 407 is further removed/recessed laterally (e.g., along the x-direction), as shown in FIG. 3C. After the lower portion 424 of the third layer 407 is removed, the first plane defined by the sidewall 416 along the first layer 404 and the second plane defined by the sidewall 416 along the third layer 407 are oriented at different non-zero angles relative to the perpendicular 420.

Figure 3D:
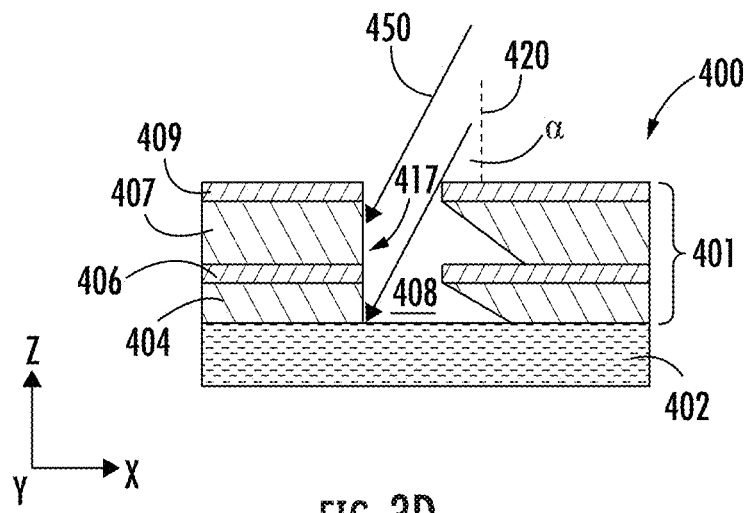
FIG. 3D is a cross-sectional side view of the device during a third angled etch, according to embodiments of the present disclosure.
Figure 3E:
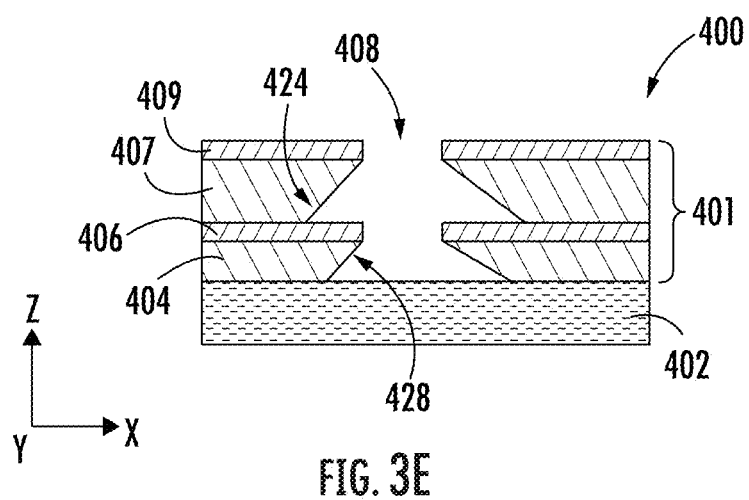
FIG. 3E is a cross-sectional side view of the device following the third angled etch, according to embodiments of the present disclosure.

In FIG. 3D, a third reactive ion etch 450 may be performed along a second sidewall 417 of the opening 408, similar to the first reactive ion etch 414. That is, ions of the third reactive ion etch 450 may be delivered into the second sidewall 417 at a third non-zero angle 'α' relative to the perpendicular 420. The third reactive ion etch 450 removes a portion of material from a lower section of the first and third layers 404, 407 without significantly removing material from an upper section of the first and third layers 404, 407, as shown in FIG. 3E. In some embodiments, the third non-zero angle of the third reactive ion etch 450 may be the same or similar to the first non-zero angle of first reactive ion etch 414.

Although not shown, reactive ions of a fourth angled etch may then be delivered into the second sidewall 417 of the opening 408 at a fourth non-zero angle relative to the perpendicular 420. In some embodiments, the second non-zero angle is greater than the third non-zero angle 'α', and impacts just the third layer 407 without impacting the first layer 404. As a result, the lower portion 424 of the third layer 407 is further removed/recessed laterally (e.g., along the x-direction). After the lower portion 424 of the third layer 407 is removed, a first plane defined by the sidewall 417 along the first layer 404 and a second plane defined by the sidewall 417 along the third layer 407 may be oriented at different non-zero angles relative to the perpendicular 420. In some embodiments, the fourth non-zero angle of the fourth reactive ion etch may be the same or similar to the second non-zero angle of the second reactive ion etch 450.

Figure 4A:
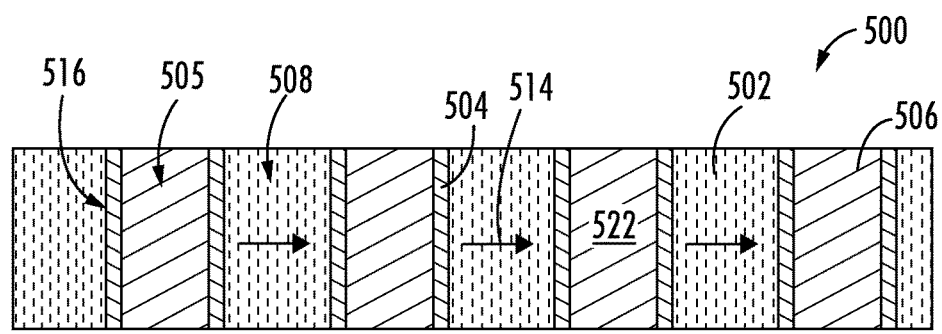
FIG. 4A is a top view of a device, according to embodiments of the present disclosure.
Figure 4B:
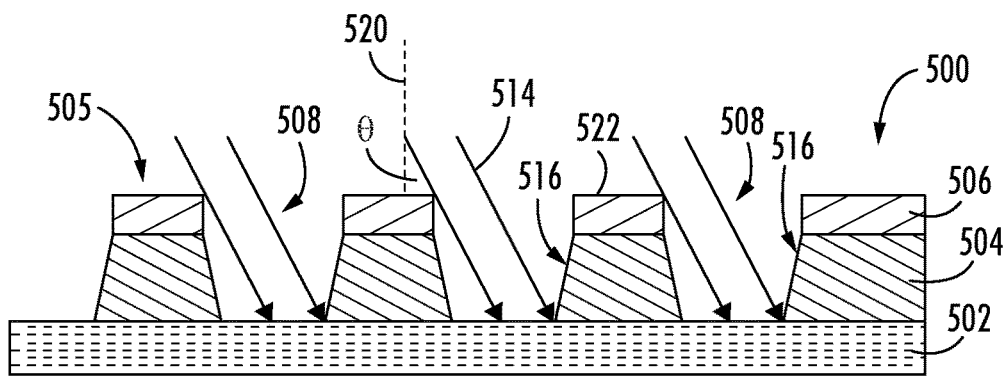
FIG. 4B is a cross-sectional side view of the device of FIG. 4A during a first angled etch, according to embodiments of the present disclosure.

FIGS. 4A-4B depict a portion of a semiconductor device (hereinafter "device") 500 including a plurality of alternating vertical structures 505 and trenches 508. Each of the vertical structures 505 may include a plurality of layers atop a substrate 702. As shown, the plurality of layers may include a first layer 504 formed atop the substrate 702, and a second layer 506 formed atop the first layer 504. The first layer 504 may be a first material type, while the second layer 506 may be a second material type, different than the first material type.

Figure 4C:
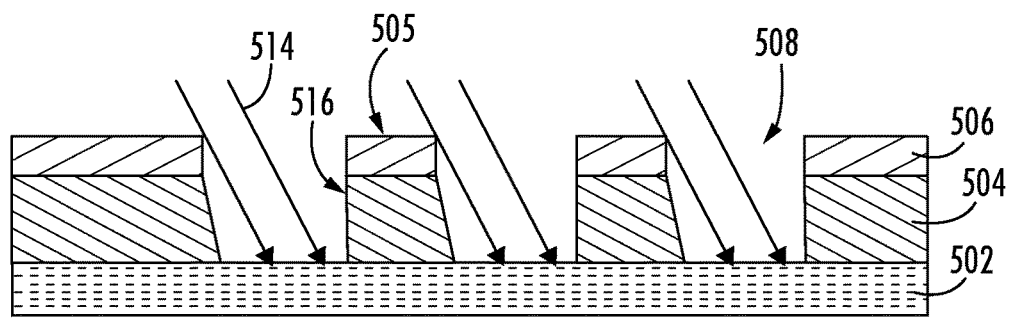
FIG. 4C is a cross-sectional side view of the device of during a second angled etch, according to embodiments of the present disclosure.
Figure 4D:
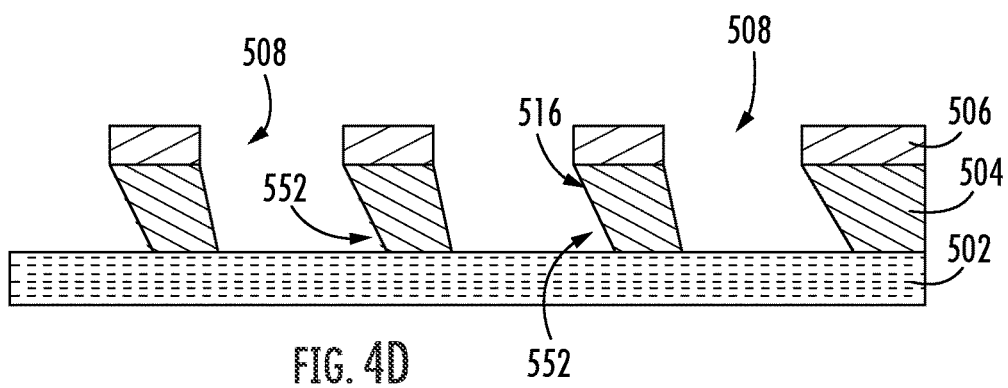
FIG. 4D is a cross-sectional side view of the device following the second angled etch, according to embodiments of the present disclosure.

As further shown, reactive ions of a first angled etch 514 may be delivered into a first sidewall 516 of each vertical structure 505 at a first non-zero angle 'Θ' relative to a perpendicular 520 extending from a top surface 522 of the second layer 506. In some embodiments, the first angled etch 514 may continue until the first sidewalls 516 are substantially vertical, as shown in FIG. 4C. In other embodiments, the first angled etch 514 may continue until a notch or indentation 552 is formed in the first layer 504, as shown in FIG. 4D. In yet other embodiments, the indentation 552 may be formed as a result of a second angled etch process delivered at a different non-zero angle.

Figure 5A:
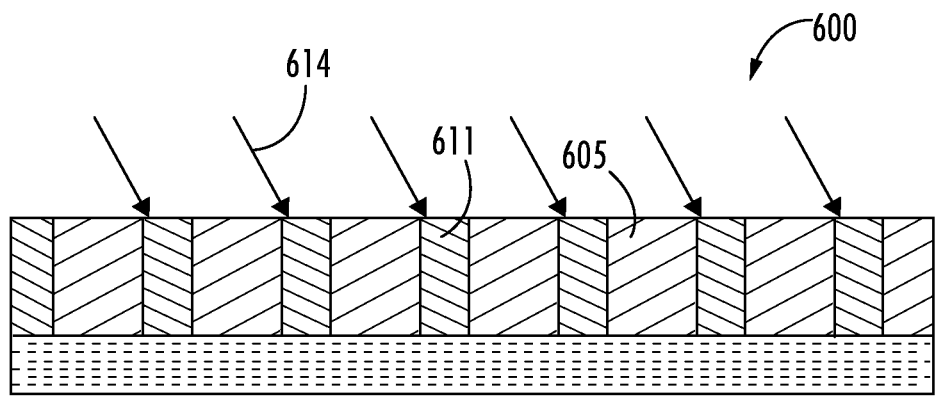
FIG. 5A is a cross-sectional side view of a device during a first angled etch to recess trenches, according to embodiments of the present disclosure.
Figure 5B:
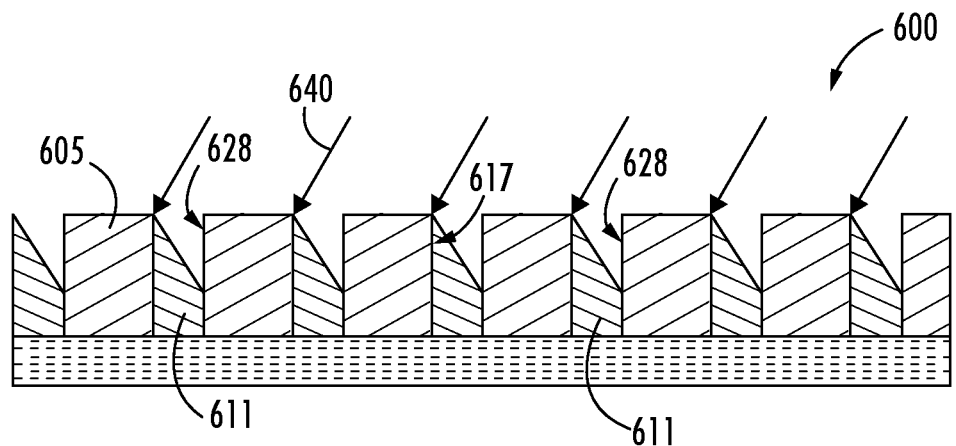
FIG. 5B is a cross-sectional side view of the device during a second angled etch to recess the trenches, according to embodiments of the present disclosure.
Figure 5C:
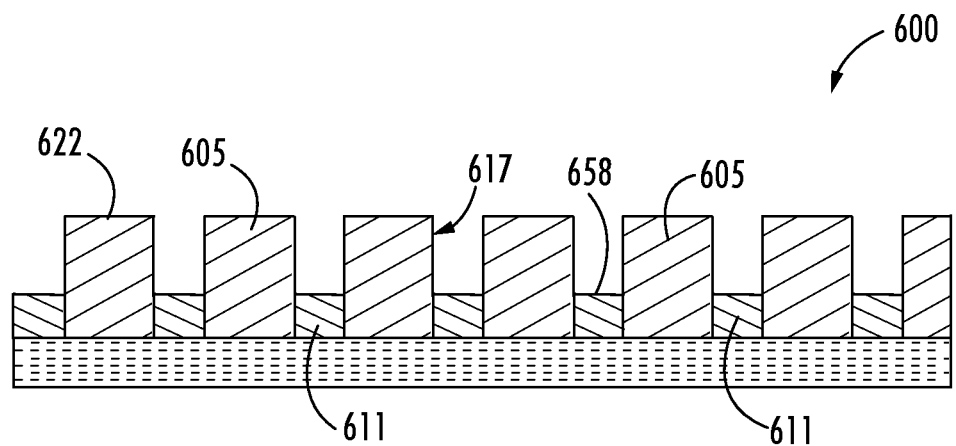
FIG. 5C is a cross-sectional side view of the device following the second angled etch to recess the trenches, according to embodiments of the present disclosure.

FIGS. 5A-5C demonstrate an approach for forming trenches without the use of an etch stop layer. In FIG. 5A, reactive ions of a first angled ion etch 614 may be delivered to a device 600 having a plurality of alternating vertical structures 605 and trench material 611. The vertical structures 605 and the trench material 611 may have different etch rates.

As shown in FIG. 5B, a portion of the trench material 611 is removed along an upper portion 628 of a first sidewall 616 of each vertical structure 605 as a result of the first angled ion etch 614. Following a second angled ion etch 640, a second portion of the trench material 611 is removed along the upper portion of a second sidewall 617 of each vertical structure 605, as shown in FIG. 5C. In this embodiment, a top surface 658 of the trench material 611 is recessed only partially relative to a top surface 622 of the second layer 606, and without the use of an etch stop layer within the device 600.

Figure 6A:
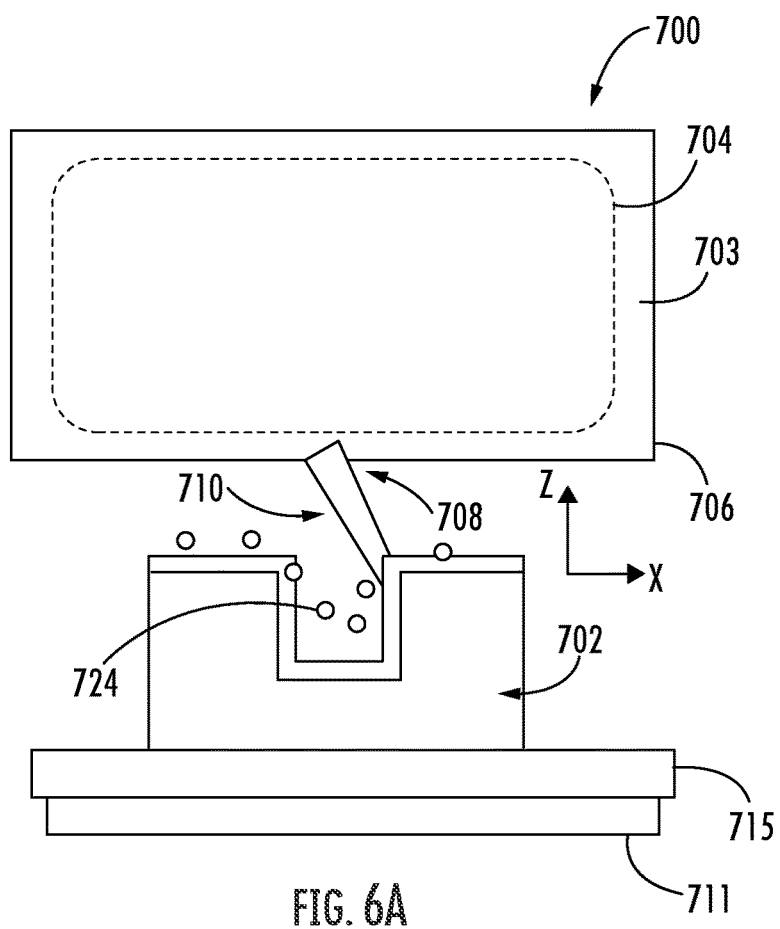
FIG. 6A illustrates an exemplary processing apparatus according to embodiments of the disclosure.

Turning now to FIG. 6A, an exemplary processing apparatus 700 for providing an ion exposure is illustrated. The processing apparatus 700 may be a compact plasma processing system operable to generate an ion beam shown as ions 710. Ions 710 may be the same or similar to the ions of the angled etch processes described herein. More specifically, a substrate 702 may be exposed to reactive neutral species 724, where the reactive neutral species 724 are derived from precursor gas composition used to generate the RIE plasma. The reactive neutral species 724 may arrive isotropically to the substrate 702, where every portion of the different exposed surfaces of the substrate 702 are impacted by the reactive neutral species 724. Notably, the present embodiments harness the principles of RIE processing where etching of a given surface is enhanced in the presence of ions. Notably, in accordance with the present embodiments, etching may take place just in regions of the substrate 702 impacted by the directional ions, i.e., in regions impacted by the ions 710, while leaving other surfaces unetched.

Figure 6B:
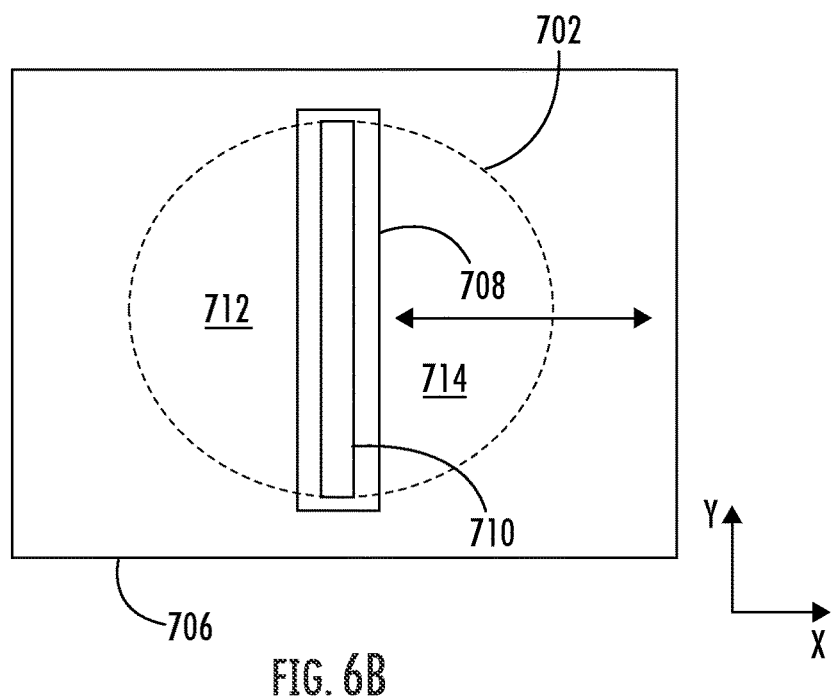
FIG. 6B depicts details of an exemplary extraction plate according to embodiments of the disclosure.

The ion beam may be extracted from a plasma 704 generated in a plasma chamber 703 by any known technique. The processing apparatus 700 may include an extraction plate 706 having an extraction aperture 708, where the ions are extracted as an ion beam from the plasma 704 and directed to the substrate 702. The substrate 702 may be the same as the substrates described herein. As shown in FIG. 6B, the extraction aperture 708 may be elongated along the Y-axis, providing a ribbon ion beam extending, for example, over an entire substrate along the direction parallel to the Y-axis. In various embodiments, the substrate 702 may be disposed on a substrate holder 715 and scanned along the X-axis to provide coverage at different regions of the substrate 702 or over the entirety of the substrate. In other embodiments, the extraction aperture 708 may have a different shape such as a square or circular shape.

In some embodiments, the plasma chamber 703 may also serve as a deposition process chamber to provide material for depositing on the substrate 702 in the deposition operation preceding etching. The substrate holder 715 may further include a heater assembly 711 for selectively heating the substrate 702 to different temperatures in different regions within the X-Y plane for selectively changing the amount of depositing material as discussed above.

During an ion exposure, reactive species may be provided or created in the plasma chamber 703 and may also impinge upon the substrate 702. While various non-ionized reactive species may impinge upon all surfaces of substrate 702, including different surfaces in one or more cavities, etching may take place in areas impacted by the ions 710, as in known RIE processes, while little or no etching takes place in regions not impacted by ions 710. Thus, referring to FIG. 3B, for example, reactive ions of the second angled etch 440 may be delivered into the first sidewall 416 of the opening 408 at the second non-zero angle 'β' relative to the perpendicular 420, which causes the second angled etch 440 to impact just the third layer 407 without impacting the first layer 404. As a result, the lower portion 424 of the third layer 407 is further removed/recessed laterally.

In further embodiments, directional etching of ions may be performed by rotating a substrate within the X-Y plane to any desired angle. Thus, a trench feature may be oriented with its long axis at a 45-degree angle with respect to the Y-axis while a ribbon beam directed to the trench feature has its axis oriented along the Y-axis as in FIG. 6B.

In additional embodiments, by scanning the substrate 702 with respect to the ion beam 710, such as along the X-axis as generally shown in FIG. 6B, the possibility is afforded to vary a directed etch across the substrate 702 to achieve location-specific directional selectivity of etching, so features within a certain region, such as region 712 of the substrate may be altered to one extent while features in another region, such as region 714, are not altered or are altered to a different extent or in a different fashion. For example, the ion beam 710 may be present when region 712 is under extraction aperture 708, while the ion beam is extinguished when the region 714 is under extraction aperture 708.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
providing a stack of layers of a semiconductor device;
forming an opening through the stack of layers, the opening defined by a first sidewall and a second sidewall; and
delivering ions into the first sidewall in a reactive ion etching process, wherein the ions are delivered at a first non-zero angle relative to a perpendicular extending from the stack of layers, wherein the reactive ion etching process removes a first portion of the stack of layers from just a lower section of the first sidewall, and wherein a plane defined by the lower section of the first sidewall is oriented at the first non-zero angle after the lower portion is removed.

2. The method of claim 1, wherein the reactive ion etching process does not remove a second portion of the stack of layers from an upper section of the first sidewall.

3. The method of claim 2, further comprising delivering ions into the second sidewall in a second reactive ion etching process, wherein the ions are delivered at a second non-zero angle relative to the perpendicular extending from the stack of layers, and wherein the second reactive ion etching process removes a first portion of the stack of layers from a lower section of the second sidewall without removing a second portion of the stack of layers from an upper section of the second sidewall.

4. The method of claim 3, wherein providing the stack of layers comprises:
forming a first layer over a base layer; and
forming a second layer over the first layer, wherein the first layer is a first material, and wherein the second layer is a second material different than the first material.

5. The method of claim 4, wherein providing the stack of layers further comprises:

forming a third layer over the second layer; and forming a fourth layer over the third layer, wherein the third layer is a third material, and wherein the fourth layer is a fourth material different than the third material.

6. The method of claim 5, further comprising delivering ions into the first sidewall in a third reactive ion etching process, wherein the ions are delivered at a third non-zero angle relative to the perpendicular extending from the stack of layers, and wherein the third reactive ion etching process removes a lower portion of the third layer along the first sidewall without removing an upper portion of the third layer along the first sidewall.

7. The method of claim 6, further comprising delivering ions into the second sidewall in a fourth reactive ion etching process, wherein the ions are delivered at a fourth non-zero angle relative to the perpendicular extending from the stack of layers, and wherein the fourth reactive ion etching process removes a lower portion of the third layer along the second sidewall without removing an upper portion of the third layer along the second sidewall.

8. The method of claim 6, wherein the first non-zero angle is the same as the third non-zero angle.

9. A method for patterning opening sidewalls, the method comprising:
providing a stack of layers of a semiconductor device, the stack of layers comprising:
a first layer formed over a base layer;
a second layer formed over the first layer; and
a third layer formed over the second layer;
forming an opening through the stack of layers; and
directing ions into a sidewall of the first layer in a first reactive ion etch process, wherein the ions are delivered through the opening at a first non-zero angle relative to a perpendicular extending from the stack of layers, wherein the first reactive ion etch process removes a lower portion of the sidewall of the first layer, and wherein a plane defined by the sidewall of the first layer is oriented at the first non-zero angle after the lower portion of the sidewall of the first layer is removed.

10. The method of claim 9, further comprising directing ions into a sidewall of the second and third layers during the first reactive ion etch process, wherein the first layer is a first material, wherein the second layer is a second material-different than the first material, and wherein the third layer is a third material different than the second material.

11. The method of claim 10, wherein a first etch rate of the first layer is different than a second etch rate of the second material and different than a third etch rate of the third material, and wherein a difference between the first etch rate and the third etch rate causes a plane defined by the sidewall of the third layer to be oriented at a different angle than the plane defined by the sidewall of the first layer.

12. The method of claim 10, wherein a first etch rate of the first layer is the same as a third etch rate of the third material, and wherein a plane defined by the sidewall of the third layer is oriented at a same angle as the plane defined by the sidewall of the first layer.

13. The method of claim 9, further comprising directing ions into a sidewall of the third layer in a second reactive ion etch process, wherein the ions are delivered through the opening at a second non-zero angle relative to the perpendicular extending from the stack of layers, wherein the second reactive ion etch process removes just a lower portion of the sidewall of the third layer.

14. The method of claim 13, wherein the second reactive ion etch causes a plane defined by the sidewall of the third layer to be oriented at the second non-zero angle after the lower portion of the sidewall of the third layer is removed, and wherein the first non-zero angle is different than the second non-zero angle.

15. The method of claim 13, wherein the second reactive ion etch process impacts the third layer without impacting the first layer.

16. A method, comprising:
providing a stack of layers of a semiconductor device, the stack of layers comprising:
a first layer formed over a base layer;
a second layer formed over the first layer; and
a third layer formed over the second layer;
forming an opening through the stack of layers; and
directing ions into a sidewall of the first layer in a first reactive ion etch process, wherein the ions are delivered through the opening at a first non-zero angle relative to a perpendicular extending from the substrate, wherein the first reactive ion etch process removes a lower portion of the sidewall of the first layer without removing an upper portion of the sidewall of the first layer, and wherein a plane defined by the sidewall of the first layer is oriented at the first non-zero angle after the lower portion of the sidewall of the first layer is removed.

17. The method of claim 16, further comprising directing ions into a sidewall of the second and third layers during the first reactive ion etch process, wherein the first layer is a first material, wherein the second layer is a second material different than the first material, and wherein the third layer is a third material-different than the second material.

18. The method of claim 17, wherein a first etch rate of the first layer is different than a second etch rate of the second material and different than a third etch rate of the third material, and wherein a difference between the first etch rate and the third etch rate causes a plane defined by the sidewall of the third layer to be oriented at a different angle than the plane defined by the sidewall of the first layer.

19. The method of claim 17, wherein a first etch rate of the first layer is the same as a third etch rate of the third material, and wherein a plane defined by the sidewall of the third layer is oriented at a same angle as the plane defined by the sidewall of the first layer.

20. The method of claim 16, further comprising directing ions into a sidewall of the third layer in a second reactive ion etch process, wherein the ions are delivered through the opening at a second non-zero angle relative to the perpendicular extending from the substrate, wherein the second reactive ion etch process removes just a lower portion of the sidewall of the third layer.

\* \* \* \* \*